(12) United States Patent
Chen

(10) Patent No.: US 10,559,633 B2
(45) Date of Patent: Feb. 11, 2020

(54) FLEXIBLE DISPLAY SCREEN AND MANUFACTURING METHOD THEREFOR

(71) Applicant: SHENZHEN ROYOLE TECHNOLOGIES CO. LTD., Shenzhen, Guangdong (CN)

(72) Inventor: Yiming Chen, Guangdong (CN)

(73) Assignee: SHENZHEN ROYOLE TECHNOLOGIES CO. LTD., Shenzhen (CN)

(*) Notice: Subject to any disclaimer, the term of this patent is extended or adjusted under 35 U.S.C. 154(b) by 0 days.

(21) Appl. No.: 15/752,492

(22) PCT Filed: Dec. 30, 2015

(86) PCT No.: PCT/CN2015/099998
§ 371 (c)(1),
(2) Date: Feb. 13, 2018

(87) PCT Pub. No.: WO2017/113256
PCT Pub. Date: Jul. 6, 2017

(65) Prior Publication Data
US 2018/0240852 A1    Aug. 23, 2018

(51) Int. Cl.
*H01L 27/32* (2006.01)
*H01L 51/00* (2006.01)
(Continued)

(52) U.S. Cl.
CPC ...... *H01L 27/3244* (2013.01); *H01L 51/0097* (2013.01); *H01L 51/56* (2013.01); *H01L 51/5253* (2013.01)

(58) Field of Classification Search
CPC combination set(s) only.
See application file for complete search history.

(56) References Cited

U.S. PATENT DOCUMENTS 8,866,384 B2 * 10/2014 Wang ............... H05B 33/04
                                                    313/504
9,288,897 B2 *  3/2016 Chen ............... H05K 1/0281
(Continued)

FOREIGN PATENT DOCUMENTS

CN      1612650 A      5/2005
CN    101866944 A     10/2010
(Continued)

OTHER PUBLICATIONS

International search report issued in corresponding international application No. PCT/CN2015/099998 dated Sep. 21, 2016.
(Continued)

*Primary Examiner* — Sue A Purvis
*Assistant Examiner* — Jordan M Klein
(74) *Attorney, Agent, or Firm* — Hauptman Ham, LLP

(57) ABSTRACT

A flexible display screen and a method for manufacturing a flexible display screen are provided. The flexible display screen includes a flexible substrate, a thin-film transistor layer, an organic electroluminescent layer, and a flexible cover plate. The thin-film transistor layer is stacked on the flexible substrate and includes a driving section and a packaging section arranged around the driving section, where the packaging section is provided with at least one elongated groove, and at least two long protrusions corresponding to the groove. Two adjacent protrusions are located on both sides of the length direction of the groove. The organic electroluminescent layer is accordingly disposed on the driving section, and the flexible cover plate is stacked on a side of the organic electroluminescent layer that departs from the driving section and covers the organic electroluminescent layer and the packaging section.

16 Claims, 7 Drawing Sheets

(51) Int. Cl.
*H01L 51/56* (2006.01)
*H01L 51/52* (2006.01)

(56) References Cited

U.S. PATENT DOCUMENTS

| | | | | |
|---|---|---|---|---|
| 2005/0285522 | A1* | 12/2005 | Han | H05B 33/04 |
| | | | | 313/512 |
| 2007/0159089 | A1* | 7/2007 | Oh | H01L 27/3223 |
| | | | | 313/506 |
| 2010/0258346 | A1* | 10/2010 | Chen | H01L 21/56 |
| | | | | 174/521 |
| 2011/0001146 | A1 | 1/2011 | Yamazaki et al. | |
| 2014/0117336 | A1* | 5/2014 | Kim | H01L 51/5246 |
| | | | | 257/40 |
| 2014/0139985 | A1* | 5/2014 | Shih | H05K 5/063 |
| | | | | 361/679.01 |
| 2014/0166989 | A1* | 6/2014 | Ma | C23C 14/562 |
| | | | | 257/40 |
| 2014/0217371 | A1* | 8/2014 | Kim | H01L 51/5256 |
| | | | | 257/40 |
| 2014/0319474 | A1 | 10/2014 | Kim et al. | |
| 2015/0048329 | A1* | 2/2015 | Kim | H01L 51/5253 |
| | | | | 257/40 |
| 2017/0155082 | A1* | 6/2017 | Mu | H01L 27/3244 |

FOREIGN PATENT DOCUMENTS

| | | |
|---|---|---|
| CN | 102664239 A | 9/2012 |
| CN | 203481275 U | 3/2014 |
| CN | 103794736 A | 5/2014 |
| CN | 103985817 A | 8/2014 |
| CN | 104377223 A | 2/2015 |
| JP | 2011029176 A | 2/2011 |
| JP | 2015180930 A | 10/2015 |
| KR | 20050119892 A | 12/2005 |
| KR | 20120062191 A | 6/2012 |
| KR | 20140100733 A | 8/2014 |
| WO | 2007/141929 A | 12/2007 |

OTHER PUBLICATIONS

Extended European Search Report issued in corresponding European Application No. 15911884.3 dated Mar. 8, 2019, pp. 1-9.

* cited by examiner

FLEXIBLE DISPLAY SCREEN AND MANUFACTURING METHOD THEREFOR

RELATED APPLICATIONS

The present application is a National Phase of International Application Number PCT/CN2015/099998, filed Dec. 30, 2015.

TECHNICAL FIELD

The present disclosure relates to the field of flexible display screen technology, and particularly to a flexible display screen, and a method for manufacturing a flexible display screen.

BACKGROUND

At present, flexible display screens is more and more widely used. Most flexible displays are provided with a flexible thin-film transistor layer disposed between upper and lower flexible substrates while being coated with a thin-film packaging layer on the flexible thin-film transistor layer. Peripheral edges of two flexible protective layers are then sealed to achieve packaging of the flexible thin-film transistor layer. However, under such structure, sides of the flexible display screen have poor waterproof and anti-oxygen performance. The main reason is that cracks are prone to emerge on the periphery of flexible display screen when bending times of the flexible display screen are increased, and the cracks can easily spread to inside of the flexible display screen, thus forming intrusion paths for water and oxygen and resulting in failing the flexible display screen.

SUMMARY

It is an object of the disclosure to provide a flexible display screen having a high waterproof and anti-oxygen performance, and a method for manufacturing a flexible display screen.

To solve the technical problem above, there is provided a flexible display screen. The flexible display screen includes a flexible substrate, a thin-film transistor layer, an organic electroluminescent (also called organic light-emitting diode (OLED)) layer, and a flexible cover plate. The thin-film transistor layer is stacked on the flexible substrate and includes a driving section and a packaging section arranged around the driving section. The packaging section is provided with at least one elongated groove having a length direction parallels to a peripheral edge of the driving section and an opening departs from the flexible substrate. The packaging section is also provided with at least two elongated protrusions corresponding to the groove. Two adjacent protrusions are located on both sides of the length direction of the groove, and a length direction of each protrusion is parallel to that of the groove. The organic electroluminescent layer is accordingly disposed on the driving section. The flexible cover plate is stacked on a side of the organic electroluminescent layer that departs from the driving section and covers the organic electroluminescent layer and the packaging section.

There is also provided a method for manufacturing a flexible display screen. The method for manufacturing the flexible display screen includes the following.

A flexible substrate is provided.

A thin-film transistor layer and an organic electroluminescent layer are then formed on the flexible substrate. The thin-film transistor layer has a driving section and a packaging section disposed around the driving section. At least one groove and at least two elongated protrusions are arranged on the packaging section. A length direction of the groove is parallel to a peripheral edge of the driving section. Two adjacent protrusions are located on both sides of the length direction of the groove, and a length direction of each protrusion is parallel to that of the groove. The organic electroluminescent layer is accordingly disposed on the driving section.

A flexible cover plate is formed and then stacked on the organic electroluminescent layer, where the flexible cover plate covers the packaging section and the organic electroluminescent layer.

According to the flexible display screen and the method for manufacturing the flexible display screen of the disclosure, at least two long protrusions and al least one elongated groove are arranged on the packaging section of the thin-film transistor layer, with two adjacent long protrusions located on both sides of the groove. Thus, by the groove and the protrusions to increase stresses of the packaging section, the packaging section would not easily crack due to stresses when the flexible display screen is bent repeatedly. Moreover, cracks spreading are effectively prevented by transverse partition of the groove and the protrusions, improving edge sealing performance of the flexible display screen, further improving waterproof and anti-oxygen performance of the flexible display screen.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show some embodiments of the present disclosure. Those of ordinary skill in the art may also obtain other drawings based on these accompanying drawings without creative efforts.

DETAILED DESCRIPTION OF ILLUSTRATED EMBODIMENTS

Hereinafter, technical solutions embodied by implementations of the disclosure will be described in a clear and comprehensive manner in reference to the accompanying drawings intended for the implementations.

Figure 1:
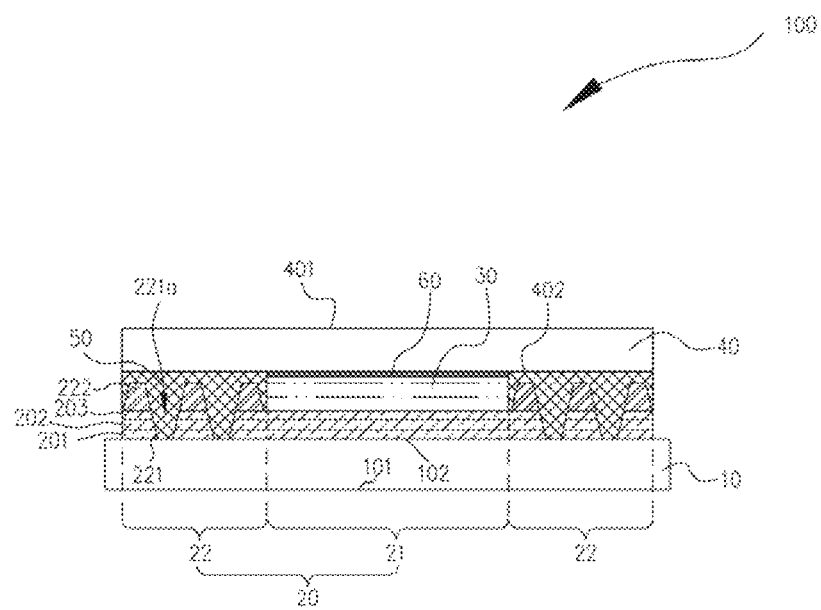
FIG. 1 is a schematic cross-sectional view illustrating a flexible display screen in accordance with an embodiment of the disclosure.
Figure 2:
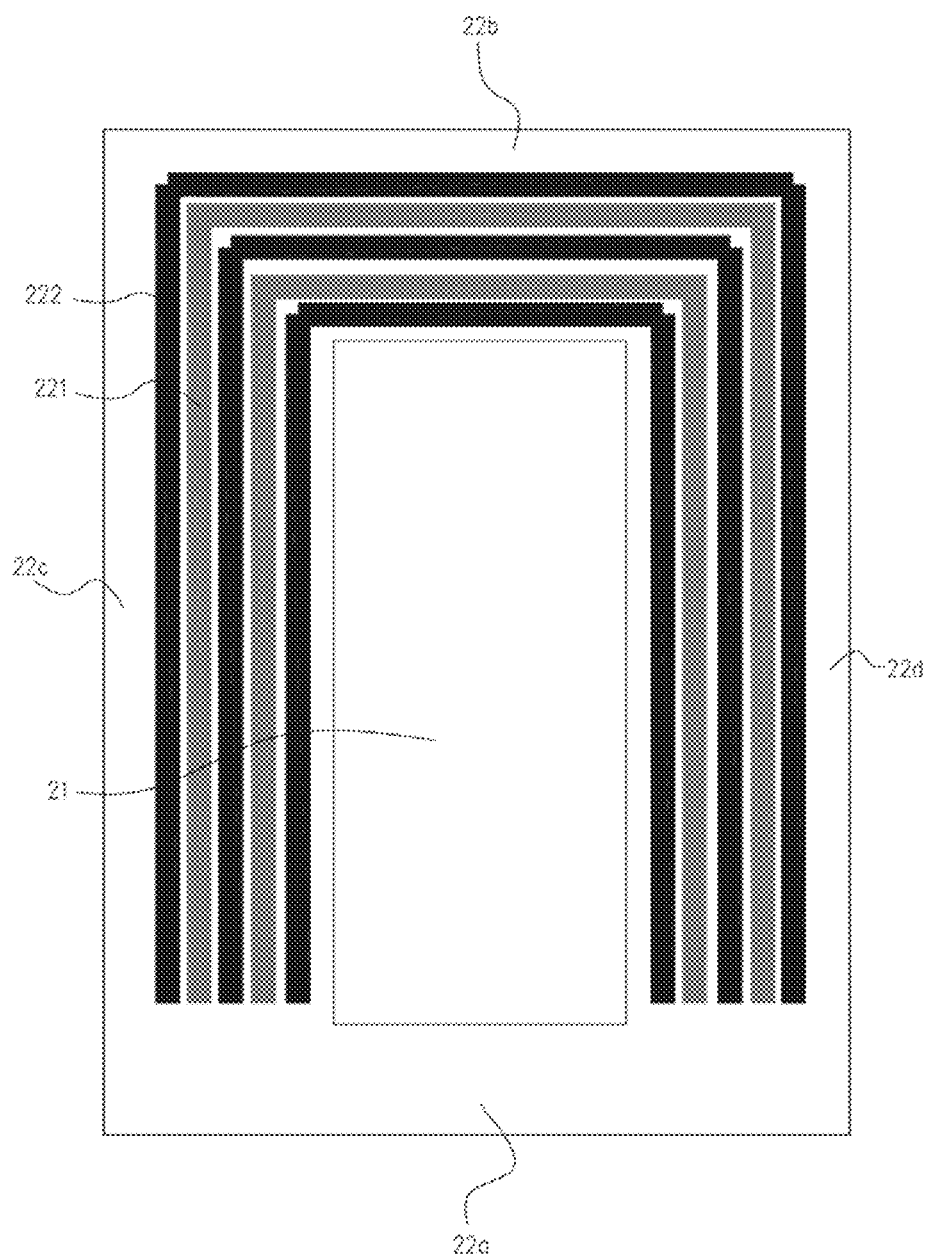
FIG. 2 is a top view illustrating a thin-film transistor layer, protrusions, and grooves of the flexible display screen in FIG. 1.

Referring to FIG. 1 and FIG. 2, according to an implementation of the disclosure, there is provided a flexible display screen 100. Flexible display screen 100 includes a flexible substrate 10, a thin-film transistor layer 20, an organic electroluminescent layer 30, and a flexible cover plate 40.

Thin-film transistor layer 20 is stacked on flexible substrate 10 and includes a driving section 21 and packaging section 22 arranged around driving section 21. Packaging section 22 is provided with at least one elongated groove 221 having a length direction parallels to a peripheral edge of driving section 21. As one implementation, packaging section 22 has a lower surface connecting flexible substrate 10 and an upper surface opposite to the lower surface. Groove 221 is provided with an opening 221a on the upper surface of packaging section 22 and caves inwards towards flexible substrate 10 corresponding to opening 221a. Packaging section 22 is further provided with at least two long protrusions 222 corresponding to groove 221. Two adjacent protrusions 222 are located on both sides of the length direction of groove 221 and adjacent to opening 221a of groove 221, and a length direction of each protrusion 222 is parallel to that of groove 221. Organic electroluminescent layer 30 is accordingly disposed on driving section 21. Driving section 21 drives organic electroluminescent layer 30 to emit light. Flexible cover plate 40 is stacked on organic electroluminescent layer 30, covers driving section 21 and packaging section 22, and bonds to packaging section 22 by a sealant 50. Sealant 50 fully coats protrusions 222 and is filled in groove 221. Sealant 50 may further be coated on the entire flexible cover plate 40 to cover packaging section 22 and organic electroluminescent layer 30.

By arranging at least two long protrusions 222 and at least one elongated groove 221 on packaging section 22 of thin-film transistor layer 20, with two adjacent long protrusions 222 located on both sides of groove 221, and bonding sealant 50 between packaging section 22 and flexible cover plate 40, with sealant 50 coating protrusions 222 and fully filled in groove 221, sealant 50 is sealed between packaging section 22 and flexible cover plate 40. Therefore, emerging and spreading of cracks on edges of flexible substrate 10 and flexible cover plate 40 are prevented after flexible display screen 100 is bent for several times, and an adhesion force between flexible cover plate 40 and flexible substrate 10 is enhanced, thus improving edge sealing performance of flexible display screen 100, and further promoting waterproof and anti-oxygen performance of flexible display screen 100. It should be understood that, flexible display screen 100 may be applied to terminals, such as mobile phones, tablet PCs, notebook computers, or applied to smart homes, and other terminals with display screens.

Flexible substrate 10 can be bent arbitrarily. Flexible substrate 10 includes a first outer surface 101 and a first inner surface 102 arranged opposite to each other, where thin-film transistor layer 20 is fixed on first inner surface 102. Flexible substrate 10 may be made from polyethylene naphthalate two formic acid glycol ester (PEN), polyethylene terephthalate (PET) polyimide resin or the like, and a thickness of flexible substrate 10 may be in a range of 10 μm to 50 μm.

Thin-film transistor layer 20 includes a driving electrode which is used to control organic electroluminescent layer 30 to emit light by a cooperation of a common electrode on organic electroluminescent layer 30. In one implementation, thin-film transistor layer 20 includes a buffer layer 201, a gate insulating layer 202 and a passivation layer 203 sequentially stacked on flexible substrate 10. The driving electrode contains a gate electrode, a source electrode, and a drain electrode of a thin-film transistor (TFT), where the gate electrode is located between buffer layer 201 and gate insulating layer 202, and the source electrode and the drain electrode are located between gate insulating layer 202 and passivation layer 203. Driving section 21 and packaging section 22 may be formed as one piece. Driving section 21 and packaging section 22 may be made of the same material. Packaging section 22 surrounds driving section 21 and acts as edges of thin-film transistor layer 20. Packaging section 22 may include a wiring side 22a, a first sealing side 22b, a second sealing side 22c, and a third sealing side 22d. Wiring side 22a is configured to provide terminals for the driving electrode and the common electrode. First sealing side 22b is arranged opposite to wiring side 22a. Second sealing side 22c and third sealing side 22d connect first sealing side 22b and wiring side 22a, and are arranged opposite to each other. Grooves 221 and protrusions 222 arranged accordingly are provided on first sealing side 22b, second sealing side 22c, and third sealing side 22d. In other implementations, protrusions may further be arranged on wiring side 22a on the basis of solutions above. Alternatively, packaging section 22 may include two wiring sides arranged opposite to each other and two sealing sides arranged opposite to each other.

As one embodiment, two grooves 221 (gray part in FIG. 2) are defined on packaging section 22 and extend along length directions of first sealing side 22b, second sealing side 22c, and third sealing side 22d. Two adjacent sub-protrusions are separated with a gap therebetween. Three protrusions 222 (black part in FIG. 2) equally spaced from each other are fixed on packaging section 22. Two grooves 221 respectively are located within gaps between three protrusions 222. Each protrusion 222 can prevent packaging section 22 from contacting water and oxygen, and grooves 221 can reduce a thickness of packaging section 22 and prevent the cracks from spreading, so as to increase flexibility of packaging section 22. Accordingly, sides sealing performance of flexible display screen 100 is improved, and then edges waterproof and anti-oxygen performance of flexible display screen 100 can be enhanced. In other embodiments, three or four grooves 221 may be arranged on packaging section 22; accordingly, four or five protrusions 222 may be arranged.

Organic electroluminescent layer 30 may be coated on driving section 21 using a mask plate vacuum process. As one implementation, organic electroluminescent layer 30 includes a plurality of pixel units arranged in the form of a matrix (not shown) and each pixel unit includes at least two pixels with different colors, so that organic electroluminescent layer 30 can display color images. Organic electroluminescent layer 30 has an anode and a cathode, where the anode is connected to the source electrode and the drain electrode of the TFT of driving section 21, the cathode is a common electrode for the entire surface, and the anode is connected to the cathode, and therefore organic electroluminescent layer 3C) can emit light under the control of the TFT. A peripheral edge of flexible cover plate 40 and packaging section 22 are arranged opposite to each other. Flexible cover plate 40 have a second outer surface 401 and a second inner surface 402 arranged opposite to each other.

Flexible cover plate 40 may be made of the same material as flexible substrate 10. Accordingly, flexible cover plate 40 can be bent arbitrarily. Second inner surface 402 of flexible cover plate 40 covers organic electroluminescent layer 30 and bonds to a backboard formed by thin-film transistor layer 20 formed on flexible substrate 10 using sealant 50. A thickness of flexible cover plate 40 is within 10 µm-50 µm.

As flexible cover plate 40 covers packaging section 22 and organic electroluminescent layer 30 on driving section 21, there exist gaps between flexible cover plate 40 and protrusions 222 as well as between two adjacent protrusions 222, so that sealant 50 can be filled in the gaps to achieve sealing between the peripheral edge of flexible cover plate 40 and packaging section 22, further achieving protection of driving section 21 of thin-film transistor layer 20 and organic electroluminescent layer 30. Sealant 50 can fully coat protrusions 222 and be filled in groove 221, so that, on the one hand, an adhesive area of sealant 50 can be increased, thereby enhancing adhesive force of sealant 50 and further preventing the edges of flexible cover plate 40 detaching from packaging section 22; on the other hand, sealing performance of the edges of flexible cover plate 40 and packaging section 22 can be improved, thereby improving waterproof and anti-oxygen performance. Sealant 50 may be made of a heat-sensitive resin adhesive or a photosensitive resin adhesive. Sealant 50 may be filled in groove 221 using a dispenser, and then coat protrusions 222. Sealant 50 may also be applied on wiring side 22a, and then flexible cover plate 40 may cover thin-film transistor layer 20, so that the peripheral edge of flexible cover plate 40 can be bonded to packaging section 22 using sealant 50. In other implementations, sealant 50 may be made of a optical adhesive, and also fully coated on second inner surface 402 of the entire flexible cover plate 40, thereby achieving bonding of flexible cover plate 40 with packaging section 22 and organic electroluminescent layer 30 using sealant 50.

Furthermore, flexible display screen 100 may further include a packaging layer 60 (gray part in FIG. 1). Thin-film packaging layer 60 may be sandwiched between flexible cover plate 40 and thin-film transistor layer 20, and at least cover organic electroluminescent layer 30 on driving section 21.

As one implementation, thin-film packaging layer 60 only covers organic electroluminescent layer 30. Thin-film packaging layer 60 protects organic electroluminescent layer 30 and driving section 21 to achieve the effect of waterproof and anti-oxygen. As thin-film packaging layer 60 only covers organic electroluminescent layer 30, sealant 50 directly bonds to packaging section 22, i.e., sealant 50 directly bonds to bottom and side surfaces of groove 221; as groove 221 is etched from passivation layer 203 to buffer layer 201, cross sections of buffer layer 201, gate insulating layer 202 and passivation layer 203 can be bonded to sealant 50 by groove 221; therefore sealant 50 can effectively increase adhesion between buffer layer 201, gate insulating layer 202 and passivation layer 203, preventing buffer layer 201, gate insulating layer 202 and passivation layer 203 from being destacked, and thus enhancing effectiveness of thin-film transistor layer 20. And sealant 50 is directly bond between thin-film transistor layer 20 and flexible cover plate 40, thereby increasing an adhesive force between flexible cover plate 40 and thin-film transistor layer 20.

Figure 3:
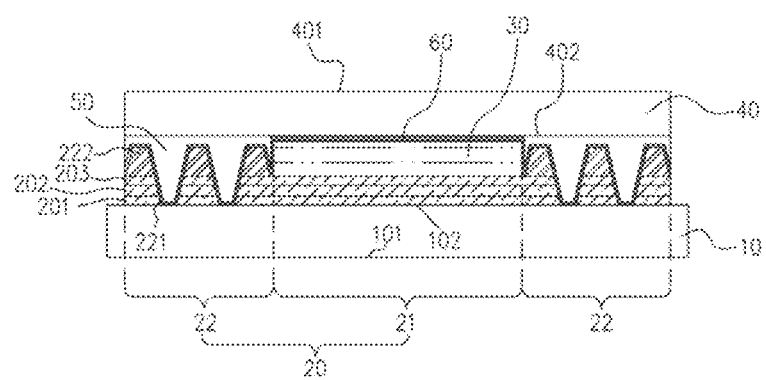
FIG. 3 is a schematic cross-sectional view illustrating a flexible display screen in accordance with another embodiment of the disclosure.

As another embodiment, as illustrated in FIG. 3, thin-film packaging layer 60 (gray part in FIG. 3) covers packaging section 22 and organic electroluminescent layer 30 accordingly arranged on driving section 21. Thin-film packaging layer 60 is fully fitted with protrusions 222 and groove 221.

Sealant 50 is between thin-film packaging layer 60 and flexible cover plate 40, and arranged opposite to packaging section 22. Thin-film packaging layer 60 may be coated on thin-film transistor layer 20 by a vacuum process. Thin-film packaging layer 60 may be fitted with top and side surfaces of protrusions 222, and also fitted with the bottom and the side surfaces of groove 221. Thin-film packaging layer 60 protects all of organic electroluminescent layer 30, driving section 21 and packaging section 22, and also protect both protrusions 222 and groove 221 on packaging section 22. Therefore, thin-film packaging layer 60 can further enhance waterproof and anti-oxygen performance of organic electroluminescent layer 30 and driving section 21. Furthermore, thin-film packaging layer 60 totally coats packaging section 22 and organic electroluminescent layer 30 accordingly arranged on driving section 21 to enhance structure strength, thus preventing cracks in thin-film transistor layer 20 from spreading, and improving usability of flexible display screen 100.

Furthermore, as one implementation, groove 221 can pass through packaging section 22. Groove 221 is etched from passivation layer 203 to buffer layer 201 and blocks packaging section 22, thereby effectively preventing cracks in packaging section 22 from spreading. And by etching on packaging section 22 groove 221 that passes through the upper surface and the lower surface of packaging section 22, internal stresses of packaging section 22 can be reduced and flexibility of packaging section 22 can be increased. In other implementations, groove 221 may only pass through passivation layer 203.

Furthermore, as illustrated in FIG. 2, each protrusion 222 may extend continuously along a side of driving section 21. As one implementation, protrusions 222 extends continuously along length directions of first sealing side 22b, second sealing side 22c, and third sealing side 22d, thereby improving sealing performance of packaging section 22, and further enhancing waterproof and anti-oxygen performance of flexible display screen 100.

Figure 4:
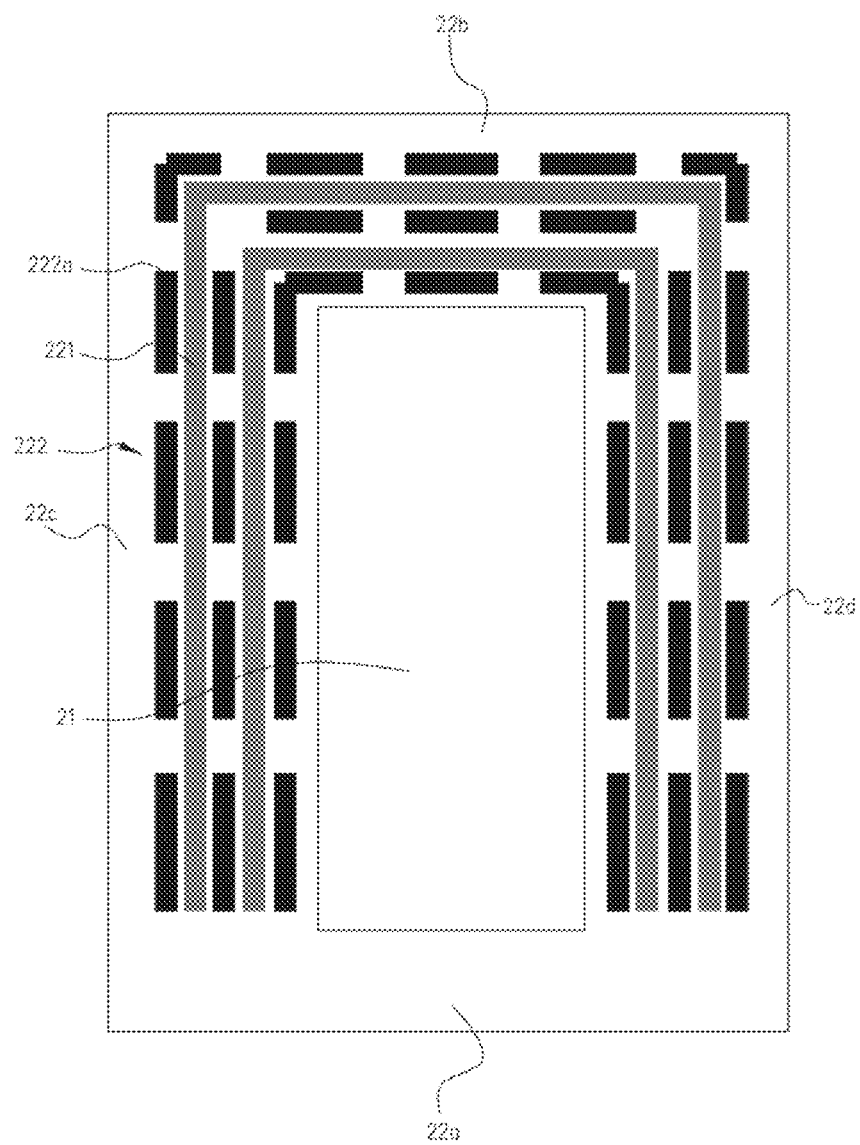
FIG. 4 is a top view illustrating a thin-film transistor layer, protrusions, and grooves of the flexible display screen in accordance with another embodiment of the disclosure.
Figure 5:
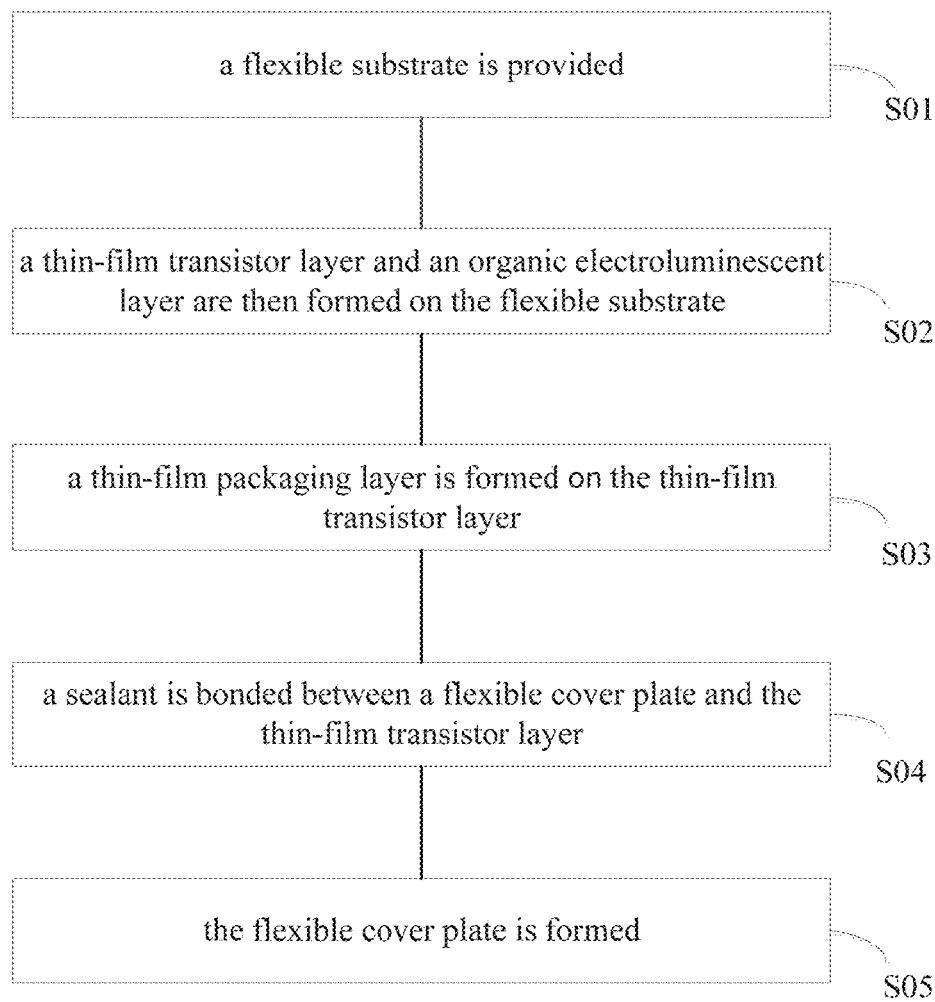
FIG. 5 is a schematic flow chart illustrating a method for manufacturing a flexible display screen in accordance with the disclosure.
Figure 6:
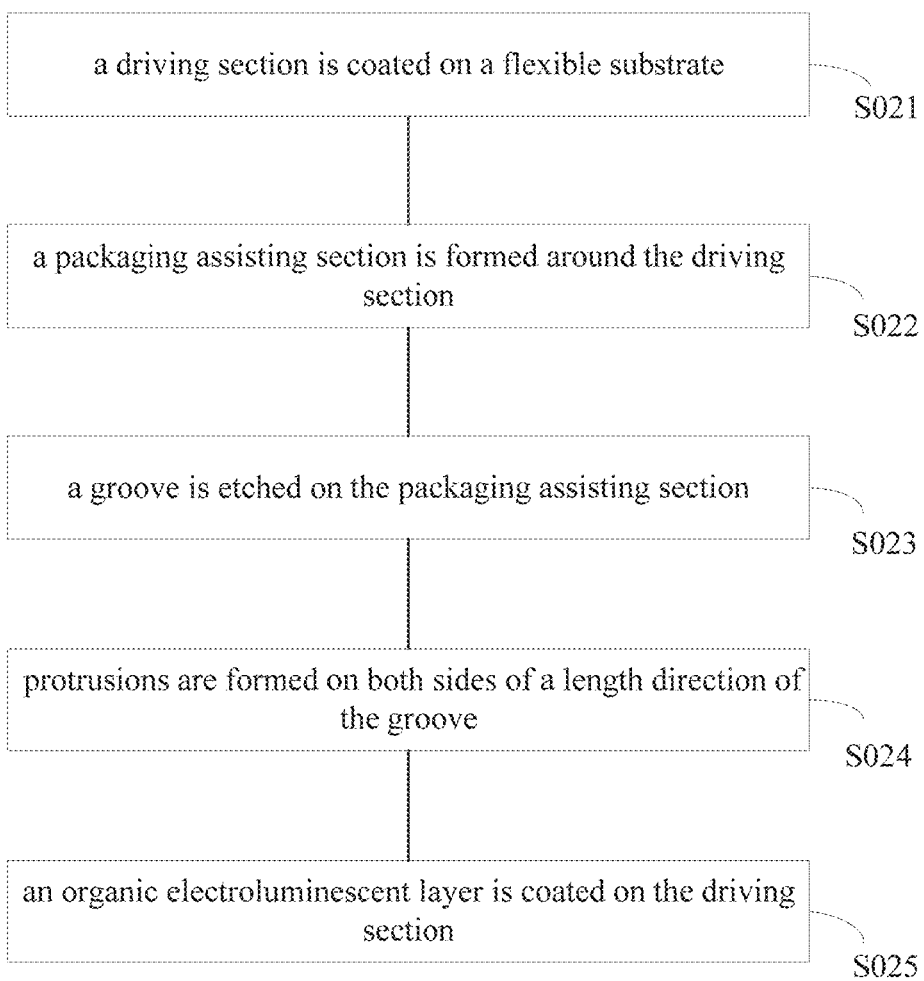
FIG. 6 is a schematic flow chart illustrating S02 of the method for manufacturing the flexible display screen in FIG. 5.

As another embodiment, as illustrated in FIG. 4, each protrusion 222 includes a plurality of sub-protrusions 222a arranged in an equal distance at the side of driving section 21, and two adjacent sub-protrusions are separated with a gap therebetween. A length direction of each sub-protrusion 222a is parallel to a length direction of the side of driving section 21. By providing the gap between two adjacent sub-protrusions 222a, protrusions 222 can be blocked, thereby reducing bending resistance of protrusions 222 against flexible display screen 100, improving flexibility of flexible display screen 100 and enhancing flexural-resistance properties of flexible display screen 100.

Furthermore, each protrusion 222 has a trapezoidal cross section and a longer end fixed on packaging section 22. For example, the number of protrusions 222 may be in a range of 2 to 20. Each protrusion 222 may have a width in a range of 10 µm to 25 µm and a height in a range of 1 µm to 10 µm. A gap between two adjacent protrusions 222 is in a range of 10 µm to 25 µm. In other embodiments, each protrusion 222 may have a semicircular cross section.

Furthermore, groove 221 has a trapezoidal cross section and a bottom end width that is less than an opening width thereof, where the opening width of groove 221 is in a range of 10 µm to 25 µm. In other implementations, groove 221 may have a semicircular cross section.

Referring to FIG. 1, FIG. 2, FIG. 5, and FIG. 6, there is also provided a method for manufacturing a flexible display screen. The method for manufacturing flexible display screen 100 includes the following operations.

At S01, a flexible substrate 10 is provided.

As an embodiment, flexible substrate 10 may be thermoformed. Flexible substrate 10 may be made from polyethylene naphthalate two formic acid glycol ester, polyethylene terephthalate, polyimide resin or the like. Flexible substrate 10 may have a thickness in a range of 10 µm to 50 µm. The disclosure is not limited thereto.

At S02, a thin-film transistor layer 20 and an organic electroluminescent layer 30 are then formed on flexible substrate 10. Thin-film transistor layer 20 has a driving section 21 and a packaging section 22 arranged around driving section 21. At least one groove 221 and at least two long protrusions 222 are arranged on packaging section 22. A length direction of groove 221 is parallel to a peripheral edge of driving section 21. Two adjacent protrusions 222 are located on both sides of the length direction of groove 221, and a length direction of each protrusion 222 is parallel to that of groove 221. Organic electroluminescent layer 30 is disposed on driving section 21.

As an embodiment, S02 may include the following operations.

At S021, driving section 21 is coated on flexible substrate 10.

A buffer layer 201, a gate insulating layer 202, and a passivation layer 203 are sequentially formed on a first inner surface 102 of flexible substrate 10. A gate electrode of a thin-film transistor (TFT) is formed in a region between buffer layer 201 and gate insulating layer 202 corresponding to driving section 21. A source electrode and a drain electrode of the TFT are formed in a region between gate insulating layer 202 and passivation layer 203. The gate electrode, the source electrode, and the drain electrode constitute a driving electrode, which can drive organic electroluminescent layer 30 to emit light and display.

At S022, a packaging assisting section (also called packaging auxiliary section) 22' is formed around driving section 21.

Figure 7:
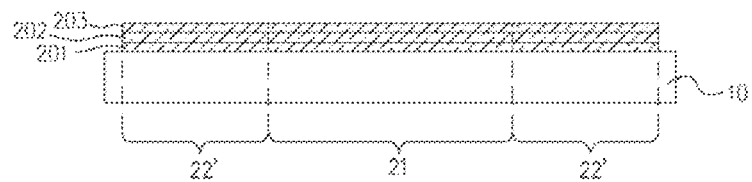
FIG. 7 is a schematic structural diagram illustrating a process of the method for manufacturing the flexible display screen in FIG. 6 of the disclosure.

Packaging assisting section 22' are formed in peripheral regions surrounding driving section 21 corresponding to thin-film transistor layer 20, and then packaging section 22 are formed by processing in the peripheral regions. To facilitate explanation, regions before forming packaging section 22 are described as packaging assisting sections 22' (as illustrated in FIG. 7) to distinguish and embody process. Packaging assisting sections 22' may include the above buffer layer 201, gate insulating layer 202 and passivation layer 203 that are formed on first inner surface 102 of flexible substrate 10 and be formed integrally with driving section 21, or packaging assisting section 22' and driving section 21 are formed separately as a stacked structure. In other embodiments, S022 may be performed before S021, or concurrently with S021.

At S023, groove 221 is then etched on packaging assisting section 22'.

Figure 8:
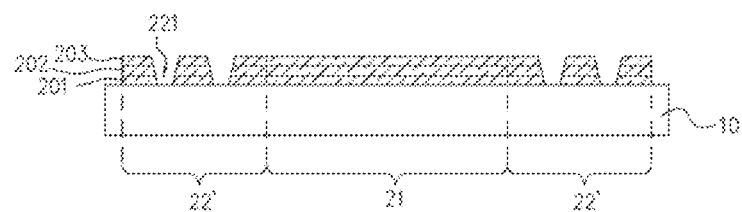
FIG. 8 is a schematic structural diagram illustrating a process of the method for manufacturing the flexible display screen in FIG. 6 of the disclosure.

After passivation layer 203 of packaging assisting section 22' is formed, groove 221 is etched from passivation layer 203 to buffer layer 201 and finally passes through packaging assisting section 22' (as illustrated in FIG. 8). So that fault surfaces of passivation layer 203, gate insulating layer 202, and buffer layer 201 are exposed. In other embodiments, S023 may be performed concurrently with S022, or concurrently with S022 and S021.

At S024, protrusions 222 are formed on both sides of the length direction of groove 221 to obtain packaging section 22, and finally thin-film transistor layer 20 is obtained.

As an embodiment, an adhesive layer (not shown) is first coated on packaging assisting section 22', and then at least two protrusions 222 are coated or inkjet-printed on the adhesive layer. Protrusion 222 is made of one material selected from a group consisting of polyethylene terephthalate, polyimide, polycarbonate (PC), epoxide resin, polyethylene (PE), and polyacrylate. The adhesive layer may be a heat sensitive resin adhesive or a photosensitive resin adhesive. After protrusions 222 are disposed at packaging assisting section 22', the adhesive layer is thermal curing or photocuring by heating or light, thereby realizing stable arrangement of protrusions 222 and packaging assisting section 22', finally obtaining packaging section 22 and increasing bonding strength of packaging section 22. Packaging section 22 surrounds driving section 21, thereby obtaining thin-film transistor layer 20. Thin-film transistor layer 20 may be any structure of a-Si, IGZO or LTPS. In other embodiments, S024 may be performed before S023, protrusions 222 are formed first at a preset position of packaging assisting section 22', and then groove 221 is etched on packaging assisting section 22'; or S024 may be performed concurrently with S023, i.e., etching groove 221 on packaging assisting section 22' and bonding protrusions 222 are performed at the same time; or S024 may be performed concurrently with S023 and S022, i.e., coat packaging section 22 arranged discontinuously on flexible substrate 10 according to the preset location to define groove 221 and form protrusions 222; or S024 may be performed concurrently with S023, S022, and S021, i.e., packaging section 22 and driving section 21 are concurrently coated on flexible substrate 10.

At S025, organic electroluminescent layer 30 is coated on driving section 21.

As an embodiment, organic electroluminescent layer 30 is formed by mask plate vacuum coatings. Organic electroluminescent layer 30 may have the same size as driving section 21. Organic electroluminescent layer 30 may have an anode and a cathode, where the anode is connected to the source electrode and the drain electrode of the TFT in driving section 21, the cathode is a common electrode for the entire surface, and the anode is connected to the cathode, so that organic electroluminescent layer 30 can emit light under the control of the TFT. In other embodiments, S025 may be performed after S023 and before S024; or after S022 and before S023; or after S021 and before S022; or in synchronization with any of S022, S023, or S024; or in synchronization with S022 and S023; or in synchronization with S022 and S024.

At S03, a thin-film packaging layer 60 is formed on thin-film transistor layer 20, where thin-film packaging layer 60 at least covers organic electroluminescent layer 30.

Thin-film packaging layer 60 protects organic electroluminescent layer 30. Thin-film packaging layer 60 is likewise formed by a vacuum coating process. Thin-film packaging layer 60 is formed by alternatively forming an inorganic material layer (not shown) and an organic material layer (not shown) via vacuum-coating. The inorganic material layer is at least one selected from a group consisting of silicon nitride, aluminum oxide, titanium dioxide, and silicon dioxide. The organic material layer is at least one selected from a group consisting of polyethylene terephthalate, polyimide, polycarbonate, epoxy resin, polyethylene and polyacrylate. The inorganic material layer coats the organic material layer. Thin-film packaging layer 60 is provided with an inorganic material layer at the outermost side away from organic electroluminescent layer 30.

As another embodiment, thin-film packaging layer 60 covers packaging section 22 and organic electroluminescent layer 30 arranged on driving section 21, and to be fully fixed with protrusions 222 and groove 221.

At S04, a sealant 50 is bonded between a flexible cover plate 40 and thin-film transistor layer 20, and at least coats packaging section 22. Sealant 50 is bonded to packaging section 22, coats protrusions 222, and is fully filled in groove 221. As an embodiment, sealant 50 is directly bonded to packaging section 22, to top and side surfaces of protrusions 222, and also to side surfaces and bottom of groove 221. Sealant 50 is made of a photosensitive resin adhesive material. Sealant 50 is applied to packaging section 22 by a dispenser to be sufficiently in contact with packaging section 22. In other embodiments, S04 may be performed after S02 and before S03. Sealant 50 may also be fully coated on thin-film packaging layer 60.

At S05, flexible cover plate 40 is formed and then stacked on organic electroluminescent layer 30, with flexible cover plate 40 covering packaging section 22 and driving section 21.

As an embodiment, flexible cover plate 40 is made of the same material as flexible substrate 10. Flexible cover plate 40 covers thin-film packaging layer 60. An adhesive is bonded between thin-film packaging layer 60 and flexible cover plate 40. Sealant 50 is bonded between flexible cover plate 40 and packaging section 22 or coats on the entire flexible cover plate 40, so that flexible cover plate 40 can cover thin-film packaging layer 60. After flexible cover plate 40 is sufficiently in contact with sealant 50, sealant 50 may be irradiated by ultraviolet and then cured, thereby realizing stability between flexible cover plate 40 and packaging section 22, achieving sealing of edges of flexible display screen 100, and ensuring waterproof and anti-oxygen performance of flexible display screen 100.

According to the flexible display screen and the method for manufacturing the flexible display screen of the disclosure, at least two long protrusions and at least one elongated groove are arranged on the packaging section of the thin-film transistor layer, where two adjacent long protrusions are located on both sides of the length direction of the groove. Thus, by grooves and protrusions to increase stress of the packaging section, the packaging section will not easily crack due to the stress when the flexible display screen is bent for several times. Moreover, cracks spreading are effectively prevented by transverse partition of the groove and the protrusions, thereby improving edge sealing performance of the flexible display screen, and further promoting waterproof and anti-oxygen performance of the flexible display screen.

The above are exemplary implementations of the disclosure. It should be noted that, it will be apparent to those skilled in the art that various improvements and modifications can be made without departing from the principles of the disclosure, which are also considered to be within the scope of the disclosure.

What is claimed is:

1. A flexible display screen, comprising:
   a flexible substrate;
   a thin-film transistor layer;
   an organic electroluminescent layer;
   a sealant; and
   a flexible cover plate;
   wherein the thin-film transistor layer is stacked on the flexible substrate and comprises a driving section and a packaging section arranged around the driving section, wherein the packaging section is provided with at least one elongated groove having a length direction parallels to a peripheral edge of the driving section and an opening departs from the flexible substrate;
   wherein the packaging section is provided with at least two elongated protrusions corresponding to the groove, two adjacent protrusions are respectively located on opposite sides of the groove, and a length direction of each protrusion is parallel to that of the groove;
   wherein the organic electroluminescent layer is accordingly disposed on the driving section, the flexible cover plate is stacked on a side of the organic electroluminescent layer that departs from the driving section, and covers the organic electroluminescent layer and the packaging section;
   wherein the sealant is directly connected with the protrusions;
   further comprising a thin-film packaging layer that is sandwiched between and directly connected with the flexible cover plate and the organic electroluminescent layer.

2. The flexible display screen of claim 1, wherein the groove passes through the packaging section.

3. The flexible display screen of claim 1, wherein the protrusions extend continuously along sides of the driving section.

4. The flexible display screen of claim 1, wherein each protrusion comprises a plurality of sub-protrusions arranged equidistantly at a side of the driving section, and two adjacent sub-protrusions are separated with a gap therebetween.

5. The flexible display screen of claim 1, wherein each protrusion has a cross section that is trapezoidal and a longer end fixed to the packaging section.

6. The flexible display screen of claim 5, wherein the number of the protrusions is in a range of 2 to 20, each protrusion has a width that is in a range of 10 µm to 25 µm and a height that is in a range of 1 µm to 10 µm, and a gap between two adjacent protrusions is in a range of 10 µm to 25 µm.

7. The flexible display screen of claim 1, wherein the groove has a cross section that is trapezoidal and a bottom end width that is less than an opening width thereof, wherein the opening width of the groove is in a range of 10 µm to 25 µm.

8. The flexible display screen of claim 1, wherein the packaging section is divided by the groove into two parts, each part of the packaging section has a trapezoidal shape.

9. The flexible display screen of claim 8, wherein each part of the packaging section has a lateral side continuous from a lateral side of the protrusion above each part of the packaging section.

10. The flexible display screen of claim 1, wherein the protrusions each have a height less than a height of the organic electroluminescent layer.

11. A method for manufacturing a flexible display screen, comprising:
    providing a flexible substrate;
    forming a thin-film transistor layer and an organic electroluminescent layer on the flexible substrate; wherein the thin-film transistor layer has a driving section and a packaging section disposed around the driving section; at least one groove and at least two elongated protrusions are arranged on the packaging section, a length direction of the groove is parallel to a peripheral edge of the driving section, two adjacent protrusions are respectively located on opposite sides of the groove, and a length direction of each protrusion is parallel to that of the groove; and the organic electroluminescent layer is accordingly disposed on the driving section;

bonding a sealant, wherein the sealant is directly connected with the protrusions; and forming a flexible cover plate and stacking the flexible cover plate on the sealant and the organic electroluminescent layer, with the flexible cover plate covering the packaging section and the organic electroluminescent layer;

further comprises the following, after forming the thin-film transistor layer and the organic electroluminescent layer on the flexible substrate and before bonding the sealant;

forming a thin-film packaging layer on the organic electroluminescent layer, with the thin-film packaging layer directly connected with the flexible cover plate and the organic electroluminescent layer.

12. The method of claim 11, wherein during forming the thin-film packaging layer on the thin-film transistor layer, the thin-film packaging layer is formed by vacuum coatings.

13. The method of claim 12, wherein the thin-film packaging layer is formed by alternatively forming an inorganic material layer and an organic material layer via vacuum-coating; wherein the inorganic material layer is at least one selected from a group consisting of silicon nitride, aluminum oxide, titanium dioxide, and silicon dioxide and the organic material layer is at least one selected from a group consisting of polyethylene terephthalate, polyimide, polycarbonate, epoxy resin, polyethylene, and polyacrylate.

14. The method of claim 11, wherein during forming the thin-film transistor layer and the organic electroluminescent layer on the flexible substrate, the protrusions is made from one material selected from a group consisting of polyethylene terephthalate, polyimide, polycarbonate, epoxy resin, polyethylene, and polyacrylate.

15. The method of claim 11, wherein forming the thin-film transistor layer on the flexible substrate comprises:

coating the driving section on the flexible substrate;

forming a packaging assisting section around the driving section;

etching the groove on the packaging assisting section;

forming the protrusions respectively on opposite sides of the groove to obtain the packaging section, so as to obtain the thin-film transistor layer; and coating the organic electroluminescent layer on the driving section.

16. The method of claim 15, wherein during etching the groove on the packaging section, the groove passes through the packaging section.

* * * * *